United States Patent
Moresco et al.

(10) Patent No.: US 6,223,814 B1
(45) Date of Patent: *May 1, 2001

(54) FLEXIBLE FOIL FINNED HEATSINK STRUCTURE AND METHOD OF MAKING SAME

(75) Inventors: Larry L. Moresco, San Carlos; Vivek Mansingh, Santa Clara, both of CA (US)

(73) Assignee: Fujitsu Limited (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/491,235

(22) Filed: Jan. 25, 2000

Related U.S. Application Data

(63) Continuation of application No. 09/020,052, filed on Feb. 6, 1998, now Pat. No. 6,026,895.

(51) Int. Cl.⁷ ........................................... H05K 7/20
(52) U.S. Cl. ................. 165/185; 165/80.3; 174/16.3; 257/722; 361/704
(58) Field of Search ................... 165/905, 80.3, 165/185; 174/16.3; 257/722; 361/692, 703, 704

(56) References Cited

U.S. PATENT DOCUMENTS

| | | |
|---|---|---|
| 3,095,037 | 6/1963 | Bohm . |
| 4,190,098 | 2/1980 | Hanlon . |
| 4,296,455 | 10/1981 | Leaycraft et al. . |
| 4,447,842 | 5/1984 | Berg . |
| 4,498,530 | 2/1985 | Lipschutz . |
| 4,770,242 | 9/1988 | Daikoku et al. . |
| 4,897,712 | 1/1990 | Prokopp . |
| 4,923,000 | 5/1990 | Nelson .................................. 165/122 |
| 4,964,458 | 10/1990 | Flint et al. . |
| 4,984,066 | 1/1991 | Iversen . |
| 5,008,582 | 4/1991 | Tanuma et al. . |
| 5,014,117 | 5/1991 | Horvath et al. . |
| 5,022,462 | 6/1991 | Flint et al. . |
| 5,168,348 | 12/1992 | Chu et al. . |
| 5,299,090 | 3/1994 | Brady et al. . |
| 5,311,928 | 5/1994 | Marton . |
| 5,381,859 | 1/1995 | Minakami et al. . |
| 5,406,451 | 4/1995 | Korinsky . |
| 5,471,367 | 11/1995 | Krumweide et al. . |
| 5,518,071 | 5/1996 | Lee . |
| 5,558,156 | * 9/1996 | Tsutsui .................................. 165/84 |
| 5,568,683 | 10/1996 | Chia et al. . |
| 6,026,895 | * 2/2000 | Moresco et al. ...................... 165/185 |

FOREIGN PATENT DOCUMENTS

| | | |
|---|---|---|
| 55-027679 | 2/1980 | (JP) . |
| 4-199736 | 7/1992 | (JP) . |
| 5-21664 | 1/1993 | (JP) . |
| 1670817 | 8/1991 | (SU) . |
| 1714724 | 2/1992 | (SU) . |

OTHER PUBLICATIONS

Author Unknown, *IBM Technical Disclosure Bulletin*, "Microfin Cooling", vol. 34, No. 3, Aug. 1991, pp. 424–426.

* cited by examiner

Primary Examiner—Leonard Leo
(74) Attorney, Agent, or Firm—Coudert Brothers

(57) ABSTRACT

Heatsink structures for integrated circuit chips, chip packages, printed wiring boards and the like are disclosed. The heatsink structures according to the present invention have thin flexible cooling fins which move and vibrate under the flow of a cooling fluid. In one embodiment, the fins comprise a thin metal film, such as copper or aluminum, which is laminated to a thin polymeric layer. The polymeric layer provides resilience and elasticity to the metal film and the cooling fins.

20 Claims, 5 Drawing Sheets

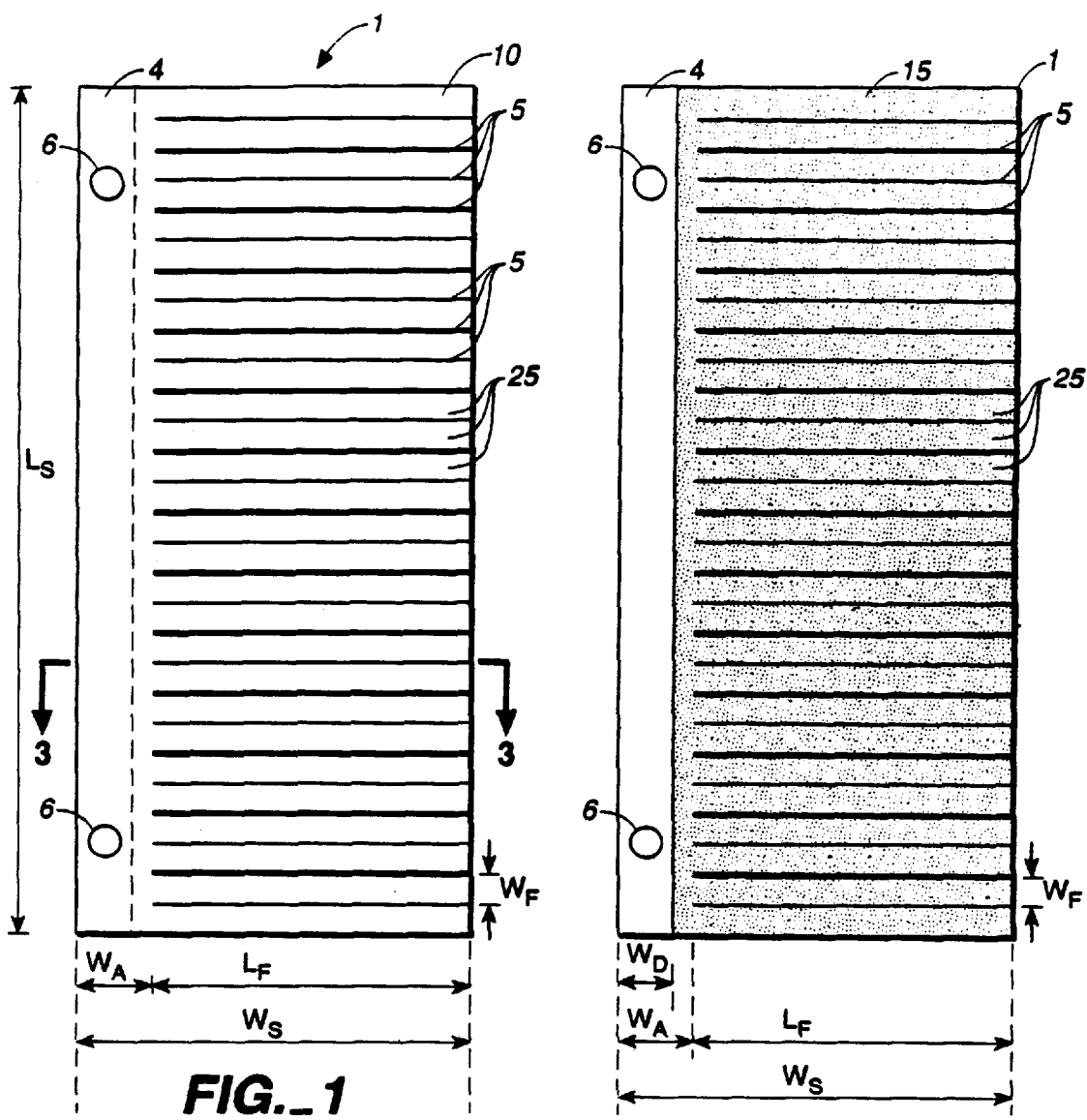
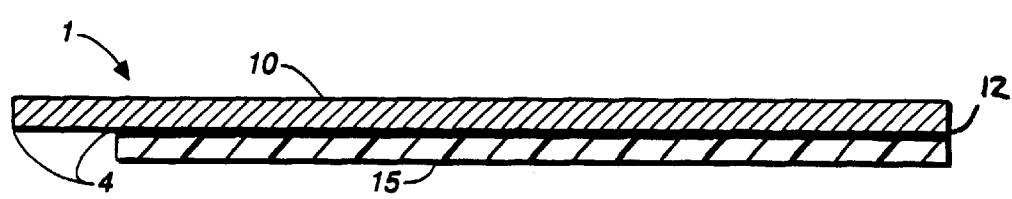

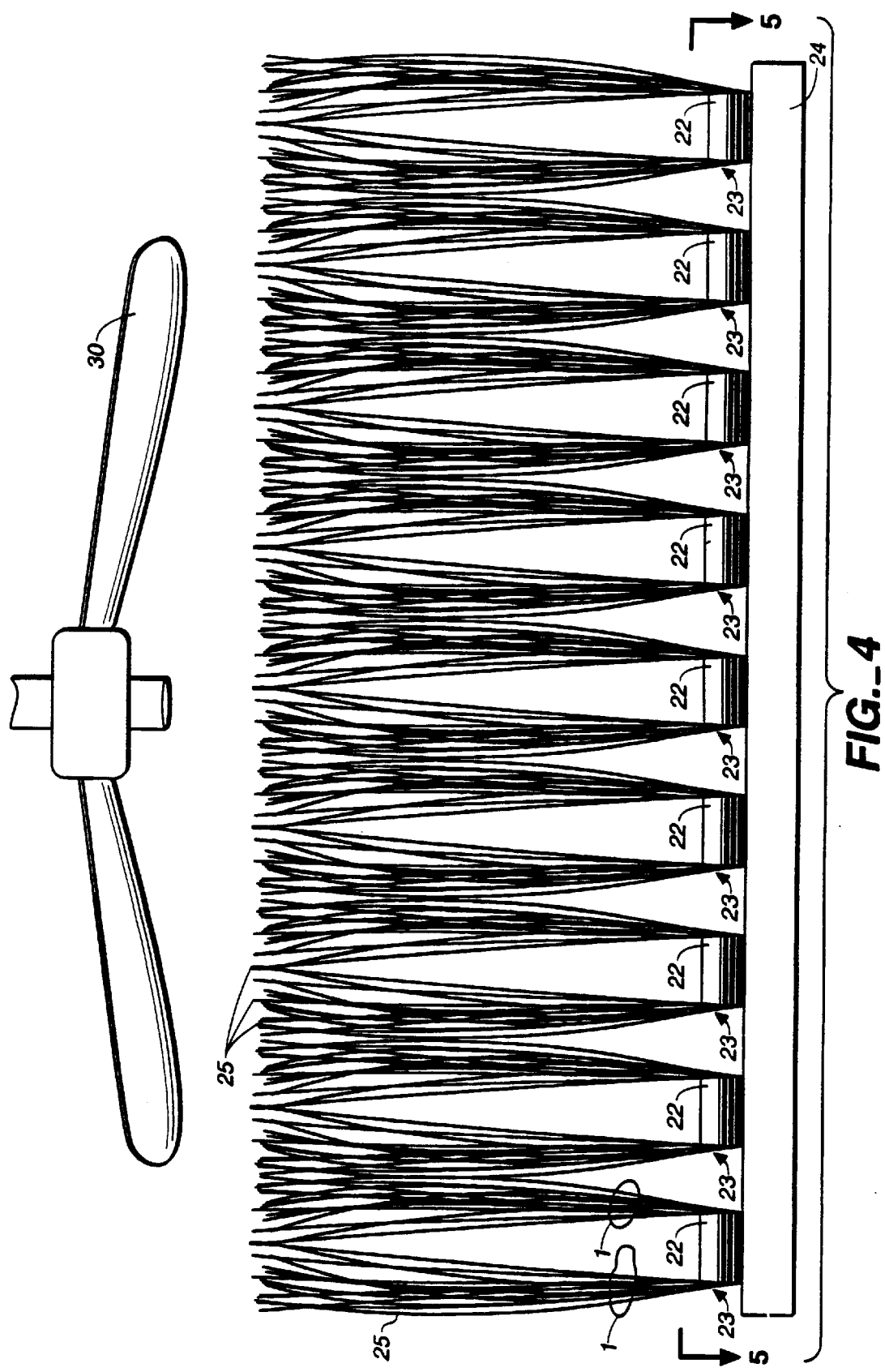
FIG._4

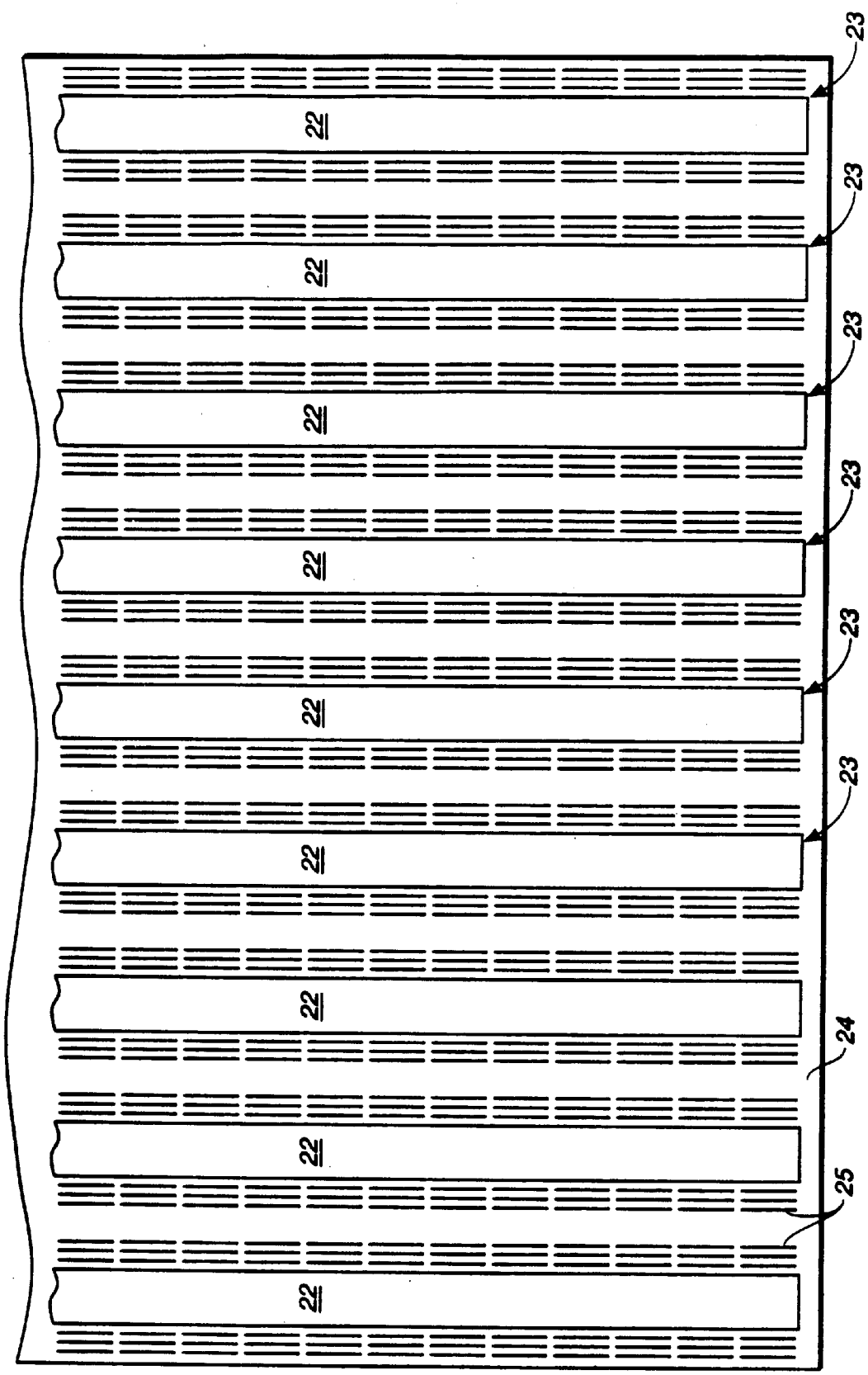

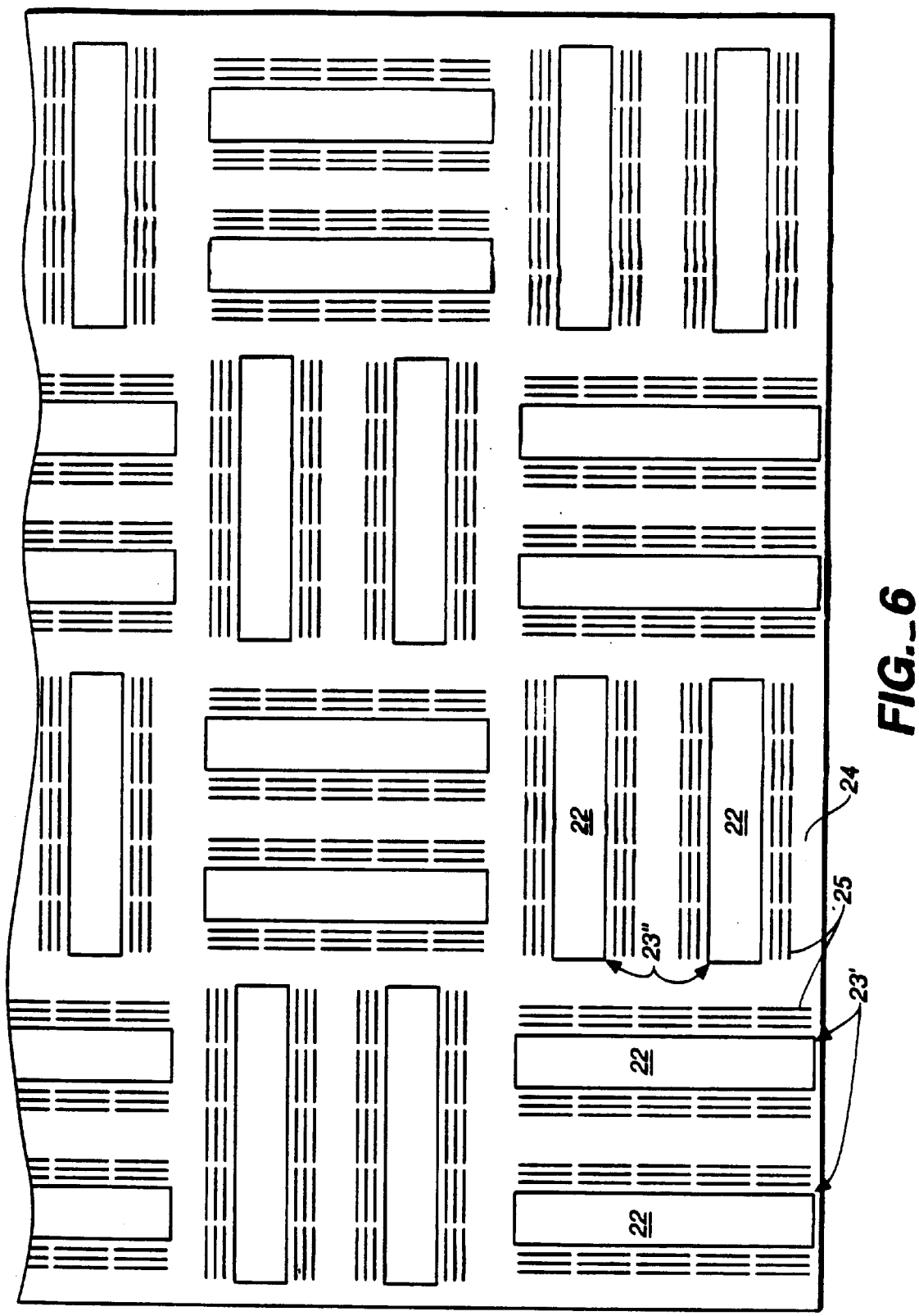
FIG._6

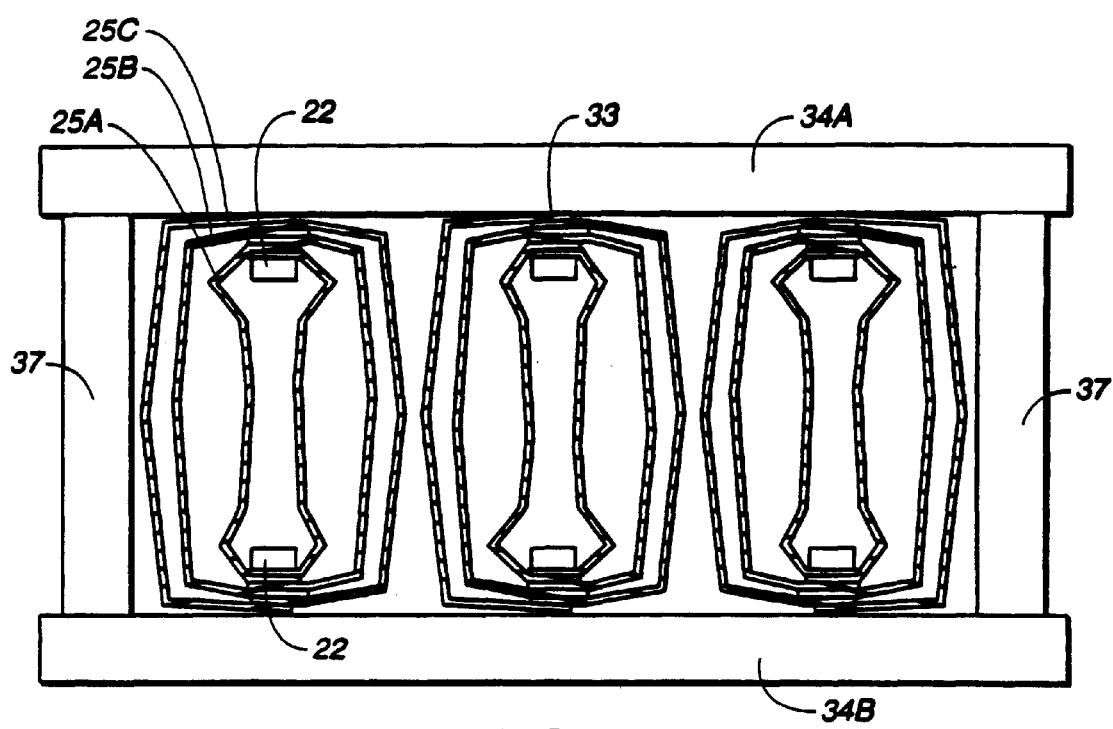
FIG._7

FLEXIBLE FOIL FINNED HEATSINK STRUCTURE AND METHOD OF MAKING SAME

This is a continuation application of U.S. patent application Ser. No. 09/020,052, filed Feb. 6, 1998 now U.S. Pat. No. 6,026,895.

FIELD OF THE INVENTION

The present invention relates to novel flexible foil finned heatsink structures and methods of making such structures for cooling heat-generating devices or for cooling power dissipation in electronic devices in a small volume. More particularly, an exemplary heatsink structure according to the present invention includes a plurality of thin metal back polymer films sliced into individual fins, then stacked and bonded together, and, when fully assembled, attached to an electrical device. The fabricated heatsink structure is capable of having a large cooling surface disposed in a small volume such that heatsink may be cooled by a cooling fluid in the small volume without requiring a substantial pressure drop in the cooling fluid.

BACKGROUND OF THE INVENTION

Heat dissipating devices, such as heatsinks, are known in the art of solid state electronics technology. Such devices are used to cool solid state components and printed circuit boards that have heat generated from the condensely packaged solid state components. Many circuit boards and individual solid state components must be cooled since excessive elevated temperatures could cause a change in the electrical performance or degrade the materials of the boards and components, leading to possible failure of the boards and components themselves. Consequently, in order for many solid state components to function properly, the heat must be removed to maintain proper operating temperatures for the components. Many attempts have been made to construct a low-cost and high-efficiency heatsink that can cool an individual circuit component, component package, or circuit board in a limited amount of space. However, so far such attempts have been unsuccessful in satisfying all of these objectives.

Many conventional heatsinks, such as pin-fin heatsinks and channeled-fin heatsinks, require the costly step of machining or channeling out a hollow area in the electrical device or platform where the heatsinks are inserted or mounted. Many of these heatsinks, such as channeled-fins, are removably inserted into channels requiring an additional structure, such as expansible conduits. These additional structures increase manufacturing costs. Moreover, because most of these heatsinks require hollow spaces or insulating inserts between the heat-generating component and the cooling device to operate, the heat flow from the heat-generating component is impaired and therefore the cooling device cannot effectively dissipate heat.

It is also known in the art to cool electronic devices by providing a conductive link of material, such as conductive pistons or spring elements, between the device and cap of a cold plate. The conductive links must be capable of forming a good interface contact over as large an area as possible in order to maintain a low thermal resistance. With cooling pistons, interfaces are difficult to form because the devices may be tilted, resulting in unsatisfactory point or line contact. To solve this problem, a conformal means is often used at the piston end to interface with the device. Unfortunately, the conformal means adds thermal resistance and increases costs.

Another example of conductive links is provided by U.S. Pat. No. 5,014,117 to Horvath, et al., where a set of fins and corresponding clips are used to convey heat from integrated circuit chips to a cold plate. In this patent, a miniature heat-conducting plate is placed over each chip. Each miniature plate has a plurality of short, rigid vertical fins at its top surface. The cold plate has a corresponding plurality of clips, each of which has two spring-loaded sides which abut against either side of a respective rigid vertical fin of the miniature plate. The sides of each clip are angled toward one another such that each compresses against a corresponding side of the rigid fin of the miniature plate. The clips conduct heat from the rigid fins to the cold plate through their points of compressive contact. No cooling fluid is passed through the clips or the rigid fins. The compressive contact enables the miniature plate to confirm to the tilt of the chip, and enables the miniature plate and clip to move with respect to one another in the vertical direction. Such vertical movement occurs when the chip heats up and cools down. Spring bias means are included to continually force the miniature plate against the chip. While this approach is better than the piston approach at accommodating chip tilts, it requires more components, is more expensive, and it is somewhat less efficient at conducting heat.

Many other prior art heatsinks use thick and relatively expensive metal fins which are cooled directly by a cooling fluid (e.g., cooling air, or cooling liquid). Each metal fin can readily conduct heat along its length because of the metal's low thermal resistance, but is not able to efficiently couple heat to the cooling fluid unless the cooling fluid is forced through the fins at a high velocity. The low coupling efficiency is due to the formation of a static layer of cooling fluid around the fin and the fact that the thermal resistance of the static layer is much larger than the thermal resistance of the metal fin. In order to reach the flow of the cooling fluid, the heat from the fin must be conducted through the static layer by diffusion. Increasing the velocity of the cooling fluid decreases the thickness of the static layer, thereby increasing the diffusion rate of heat through the static layer. Unfortunately, the increased velocity requires a corresponding high pressure drop in the fluid flow through the heatsink, which increases the cost of operating the heatsink. As an alternative to increasing the velocity of cooling fluid, the surface area of the fins could be increased by increasing the dimensions of the fins. However, this approach increases the cost and size of the packaged components. For these reasons, the thick-fin heatsinks have not been able to efficiently dissipate large amounts of heat from small volumes of space without the need for high velocities and large pressure drops in the cooling fluid.

A representative of devices that suffer from the above-detailed disadvantages, in that the heatsinks utilize thick rigid fins or rods, as compared to the present invention for cooling electronic components, is provided below. U.S. Pat. No. 4,897,712 to Prokopp is directed toward a heatsink having a base body, on which the structural elements and a cooling element are arranged next to each other. The cooling element includes a bundle of ribs consisting of a plurality of rigid sheets arranged parallel and at a distance to one another. The sheets may be held together via a soldered bridge and are connected with one another in a material connecting manner to form a bundle of ribs, which are then connected to the base body in a material connecting manner, where the thickness of the ribs vary with the number of sheets used. In addition, intermediate sheets are interposed between the cooling sheets for determining the spacing between the cooling sheets.

U.S. Pat. No. 5,299,090, to Brady, et al. relates to a heatsink which has a bundle of rods mounted on the outer surface of an integrated circuit package. The rods are secured at one end with a retainer and are flared out at the other end into a starburst configuration. The rods may be selected from solid cylinders and tubes. However, the bundling of the rods renders a significant portion of the rods' collective surface area useless for cooling purposes. Accordingly, the heat sink of Brady et al. has a lower heat dissipation capability because of the limited surface area provided by the flared configuration of the rods. Accordingly, higher air flow rates and corresponding greater pressure drops are needed for cooling, which diminishes the attempt to achieve high heat dissipation rates low operating costs.

U.S. Pat. No. 5,406,451 to Korinsky is directed toward a heatsink which is attached to a heat-producing component and which is disposed within the housing of a personal computer in a region of substantially linear airflow caused by an outward flowing fan. For a base, the heatsink has a flat metal sheet which is attached to the component at one of its edges, rather than at one of its surfaces. The heatsink also has several long fingers extending from one or more of the remaining edges of the sheet. These fingers are arranged in rows parallel to the direction of linear airflow, each row being set at a different angle so that the tips of one row of fingers are spaced apart from the tips of the next row of fingers. The arrangement of the fingers create turbulence in the airflow, which acts to reduce the thickness of static layer of cooling fluid which surrounds the fingers. The turbulence thus enables the air flow to receive more heat from the fingers, and enables heat from the heat-producing component to be extracted more rapidly. In the disclosure in Korinsky the fingers are thick and rigid, operate with only a linear air flow, and occupy a relatively small portion of the space spanned by the heat sink. Due to this last feature, the velocity and pressure drop must be relatively high to create an adequate amount of turbulence.

In many of the foregoing references, the use of rather thick and rigid fins are disclosed for air cooling, which do not accomplish the goal of having an inexpensive efficient heatsink capable of dissipating a large amount of heat energy in a limited space. Although thick and rigid metal fins are extremely conductive, they are not efficient at coupling their heat to the flow of the cooling fluid due to the static layer of cooling fluid that forms around them. Turbulence improves this coupling, but thus far has not been as effectively employed as has been done in the present invention.

SUMMARY OF THE INVENTION

Presently in the computer industry, more and more integrated circuit chips are being employed in electronic systems in more dense packaging arrangements. Any improvement in the efficiency of heatsinks and heat exchanges could permit increases in packaging densities, and may even permit the use of still higher power dissipation in the electronic systems. Also, any reduction in the complexity of the heatsink or heat exchanger and in the assembly procedures can significantly reduce manufacturing costs. The present invention provides heatsink structures with improved efficiency which enables higher packaging densities, higher levels of dissipated power, less complex construction, and lower manufacturing costs.

Broadly stated, heatsink cooling apparatuses according to the present invention comprise a plurality of thin and flexible cooling fins which are capable of being attached to a heat-producing component which is to be cooled, such as for example an integrated-circuit (IC) chip package, a multichip module (MCM), or a circuit board. In preferred embodiments of the present invention, each flexible fin comprises a heat-conductive layer and a polymeric layer, which supports the heat-conductive layer and gives it additional resilience to bending.

The flexibility of the fins is capable of generating localized turbulence in the cooling fluid around the fin with a minimal amount of fluid velocity, the turbulence being effective in reducing the thickness of the static boundary layer. The fins may be designed with a sufficient degree of length and/or flexibility such that they are able to generate localized turbulence without an external source propelling the cooling fluid. For example, in one constructed embodiment, air heated by an array of vertical fins is able to rise upwards through the array and, in doing so, is able to impart small lateral forces to the fins which cause the fins to oscillate at or near their natural mechanical frequencies.

The thin construction of the fins also enables a plurality of fins to be attached to a heat-generating component such that the fins provide a large collective surface area while occupying a minor portion of the cooling volume above the component. This feature enables a large-surface area heat sink to be constructed which has low resistance to the flow of cooling fluid, and therefore requires low pressure drops and velocities in the cooling fluid.

An exemplary method of constructing a heatsink according to the present invention comprises forming a composite sheet comprising a layer of heat conductive material and a layer of flexible polymeric material. The layers may be laminated together or one layer may be deposited over another. Thereafter, a plurality of cuts are made in the sheet to define the fins. The cuts may be made from one or more edges of the sheet, or may be made wholly within the interior of the sheet, or may be made in a combination of these ways. One or more portions of the sheet may be left uncut to provide a common portion of material which holds a plurality of fins together. One or more fins may be stacked upon one another and attached together. Likewise, one or more sheets with common portions may be stacked upon one another with their common portions attached.

Accordingly, an object of the present invention is to provide a novel heatsink cooling apparatus having flexible cooling fins which are capable of flexing, moving, and/or vibrating when a cooling fluid is flowed over them to increase the turbulence in the cooling fluid, and to thereby increase cooling efficiency.

Another object of the present invention is to enable the surface area of a heatsink structure to be increased without incurring the conventional need to increase the pressure drop of the cooling fluid.

Another object of the present invention is to enable efficient heatsink structures to be manufactured at low costs.

Another object of the present invention is to enable a heatsink structure to be readily attached or couple to a heat-generating element regardless of the degree of planarity of the elements attachment surface.

Another object of the present invention is to enable the dimensions of a heatsink structure to be readily changed to match the element being cooled.

Another object of the present invention is to enable a heatsink structure to operate with cooling flows which emanate from any direction (omni-directional heat sink), as well as with laminar (linear) cooling flows and random cooling flows.

These objects, as well as other objects and advantages of the present invention, will become apparent from the following detailed description of the illustrated embodiments when read in conjunction with the accompanying drawings in which corresponding components are identified by the same reference numerals.

BRIEF DESCRIPTION OF THE DRAWINGS

FIG. 1 is a top plan view of a composite sheet formed by laminating a polymer film to a metal film which is used to fabricate an exemplary foil finned heatsink according to the present invention;

FIG. 2 is a bottom plan view of the composite sheet shown in FIG. 1;

FIG. 3 is a cross-sectional view of the composite sheet shown in FIG. 1 taken along the cross-section line indicated in FIG. 1.

FIG. 4 is a side view of an exemplary flexible-fin heatsink structure fabricated from a plurality of exemplary composite sheets shown in FIG. 1 according to the present invention;

FIG. 5 is a partial top plan view of an exemplary flexible-fin heatsink structure shown in FIG. 4.

FIG. 6 is a partial top plan view of another exemplary flexible-fin heatsink structure having several construction aspects in common with the structure shown in FIGS. 4 and 5.

FIG. 7 is a side view of a third exemplary embodiment of the flexible-fin heatsink attached to two base plates according to the present invention.

DETAILED DESCRIPTION OF THE INVENTION

This description will detail the design and fabrication of an exemplary high efficient heatsink shown in FIGS. 1 to 5. The heatsink of the present invention may be used with a liquid coolant or a gaseous coolant (e.g., air), and may be used to cool components in any electrical apparatus that consumes power and generates heat. The heatsinks according to the present invention comprise a plurality of flexible cooling fins which flex, move, and/or vibrate under the flow of the cooling fluid. (As used herein, the term "fluid" encompasses both gas coolant and liquid coolants). This action of the fins creates localized turbulence around the fins which reduces the thickness of the static layer of cooling fluid which naturally forms around the fins. The reduction of the static layer increases the conduction of heat through the static layer since the heat has less of a distance to diffuse through. Only a relatively small portion of the fin need be attached to the heat-generating component; the portion may be at one end of the fin, or may be at the middle of the fin (as well as other possible locations along the fin). The fins may be formed in rows, and may be tied together by a common strip whose length is substantially perpendicular to the lengths of the fins. The common strip may serve as an attachment portion for all of the fins tied to the common strip. Several rows of the flexible fins may be stacked upon one another at their attachment points. This feature may be facilitated with the use of common strips which tie respective sets of fins together. Several rows of fins may be attached to the heat-producing element. With these features; heatsink structures according to the present invention may be small in size, and are capable of drawing large amounts of heat away from the heat generating component with relatively low rises in heatsink temperature. Moreover, the flexible nature of the fins enables their attachment portions to readily conform to non-planar surfaces.

Referring to FIGS. 1–3, an exemplary heatsink of the present invention is constructed by using at least one thin composite sheet 1 which comprises a metal film 10 that is laminated with a flexible polymer film 15. FIG. 1 shows the front surface of sheet 1, FIG. 2 shows the back surface thereof, and FIG. 3 shows a cross-section of the laminated films (where the vertical dimension has been expanded with respect to the horizontal dimension for visual clarity). Sheet 1 is generally rectangular in shape, but may have other shapes in other embodiments. A portion of sheet 1 is sliced or cut into thin, substantially parallel strips of substantially equal width to form a plurality of thin fins 25 The cuts in sheet 1 are shown at reference number 5, and may be made along either the horizontal or vertical axis of sheet 1. Cuts 5 stop short of one edge of sheet 1 to leave a common sheet 4 of sheet 1 which ties all of the sheet's fins 25 together (i.e., physically couples the fins of a sheet to one another). Strip 4 is preferably elongated in shape, and may, as in preferred embodiments, function as an attachment strip which couples the fins 25 to the heat-generating component. Strip 4 may be attached to the heat-generating component by soldering, welding, application of thermally conductive adhesive, or application of mechanical pressure, such as clamping. Presently, soldering is preferred.

Thermally conductive film 10 may comprise any of the following metal materials: copper, silver, gold, aluminum, nickel, zinc, and combinations thereof (as alloys and/or layered combinations), and non-brittle combinations with other metals (as alloys and/or layered combinations). Of these metals, silver has the highest thermal conductivity, with copper having the second highest value, which is very close to that of silver. Copper is presently preferred due to its lower cost, its wider availability, and the fact that a thin nickel layer may be easily and inexpensively plated onto the copper as an anti-corrosion layer. Aluminum is also preferred due to its low cost and wide availability. Commercially available copper films (also called "foils") have thicknesses which range between 17.5 $\mu$m (½ oz. per square foot) to 210 $\mu$m (6 oz. per square foot), usually in increments of 35 $\mu$m from 35 $\mu$m to 210 $\mu$m.

Flexible polymer film 15 may comprise any of the following polymeric materials: polyimides (e.g., KAPTON), polyesters (e.g., MYLAR), polyamides, benzocyclobutenes, and other flexible polymeric materials. Presently, polyimides and polyesters are preferred. Commercially available KAPTON polyimide films have thicknesses which range between 25 $\mu$m to 1.2 mm, in increments of 25 $\mu$m for the most of this range (increments become larger at the upper end of the scale). Exemplary thermal conductivities of various materials is provided below in TABLE I:

TABLE I

| Material | Thermal conductivity (W/m - °K) |
| --- | --- |
| Silver | 418 |
| Copper | 393 |
| Gold | 297 |
| Aluminum | 240 |
| Brass | 119 |
| Zinc | 115 |
| Nickel | 92 |
| Polyimide | 0.2 |
| Polyester (MYLAR) | 0.1–0.2 |
| Benzocyclobutene | 0.2 |

The material of heat conductive film 10 preferably has a thermal conductivity greater than 50 W/m-K, which is met by all of the metals listed in TABLE I. The materials which may be used for polymer film 15 have heat conductivities which are much less than those of the metals, ranging from 500 to 4,000 times less. Heat conductive filler particles could be added to the polymeric material during fabrication to increase its thermal conductivity, which would enhance the polymer film's ability to convey heat from conductive film 10 to the cooling fluid. Generally, thermally conductive film 10 has a conductivity which is at least 10 times greater than that of polymeric film 15, and is generally at least 100 times greater.

Films 10 and 15 may be laminated together with the use of an adhesive, or, depending upon the chemical composition of the polymeric film 15 may be laminated by thermo-compression bonding the two films together. Presently, these are the preferred methods of laminating the films together. A thin adhesive layer is indicated in FIG. 3 at reference number 12. As another approach, the uncured liquid form of a polymeric material may be sprayed onto the heat conductive film 10 or spread onto film 10 by a doctor blade, and then cured. Although not currently preferred, it is possible to deposit or electrolessly plate a thin layer of metal onto some types of polymeric materials. After forming a thin layer, a thicker layer may be built up by electrolytic plating. Each of these four basic approaches results in the lamination of the two films.

A portion of polymer film 15 may be removed from sheet 4 to expose a portion of conductive film 10 at the back surface of sheet 1, as shown in FIG. 2. (Equivalently, films 10 and 15 may be offset from one another during the lamination process to keep film 15 from being laminated onto film 10 in the region of attachment strip 4.) The lack of polymer film 15 along attachment sheet 4 enables the attachment sheet 4 of a second composite sheet 1 to be attached (i.e., physically coupled) to the attachment sheet 4 of the first composite sheet 1 at its back surface. This construction creates a composite attachment strip having the same surface area as the attachment sheet 4 of a single sheet 1 but having twice the number of fins 25 attached to it. Additional sheets may be so attached to the composite sheet to increase the number of fins 25 associated with the composite attachment strip. The sheets may be attached by soldering, welding, application of thermally conductive adhesive, or application of mechanical pressure, such as by clamping. If solder is used to attach the sheets to one another and is used to attach the base sheet to the heat generating component, then it is preferable to use solders having different melting points. For example, the sheets may be soldered together with a high melting point solder, while the base sheet may be soldered to the heat generating element using a solder having a lower melting point.

To facilitate alignment, two or more apertures 6 may be formed along the length of strip 4, and the sheets may be placed on an alignment tool which comprises a flat surface with vertical pegs which correspond in size and spacing to apertures 6. Presently, soldering with a thin layer of solder between copper layers is preferred. The solder may be initially screened or plated onto the exposed portion of a copper film 10, and the solder may thereafter be reflowed after the sheets have been stacked on top of one another with their attachment strips 4 aligned to one another. The sheets may be compressed during reflow.

FIG. 4 shows a side view of an exemplary heatsink 10 formed by attaching a plurality of composite sheets 1 to a surface of a heat-generating component 24. More specifically, six sheets 1 have been attached together at their attachment strips 4, preferably by solder, to form a bundle 23, which in turn is attached to a surface of a heat-generating component 24. The sheets are preferably stacked in an alternating manner such that the fins of one sheet are on the opposite side as the fins of an adjacent sheet (e.g., odd-numbered sheets on one side, even-numbered sheets on another). As is shown in FIG. 4, each sheet 1 of a bundle 23 is folded by approximately 90 degrees along a line which runs parallel to the length of its attachment strip 4, and which is located between its attachment sheet 4 and its fins 25. This fold causes the fins 25 to face upward when the bundle 23 is attached to component 24. The sheets may be folded before bundle 23 is attached to component 24. In this case, the folding operation may be facilitated by attaching a strip 22 of semi-flexible or rigid material to one surface of the composite attachment strip prior to the folding operation. (Strip 22 is more rigid than sheet 1.) With strip 22 in place, the sheets 1 may be folded by placing the flat bundle against a flat surface with strip 22 facing upward, and then rotating strip 22 against the flat surface to create the folds.

Nine bundles 23 are shown in FIG. 4. Bundles 23 are preferably spaced apart from one another by equal distances. The spacing distance may be substantially equal to the widths of bundles 23, as measured at the attachment ends, and may be larger if the cooling requirements of component 24 permit fewer bundles 23 to be used. FIG. 5 shows a top cut-section view of bundles 23 and component 24, as taken through the cut plane indicated in FIG. 4. When a semi-flexible strip 22 is employed, the composite attachment strip of bundle 23 is sufficiently flexible to enable it to conform to a non-planar surface of heat-generating component. When a rigid strip 22 is employed, a non-planar surface may be accommodated by the solder material or heat-conductive adhesive material used to attach bundle 23 to heat-generating component 24.

Having thus described the general construction of an exemplary heatsink structure, exemplary selections of the dimensions of films 10 and 15 and fins 25 are now described. Referring to FIG. 1, the length of sheet 1 is designated as $L_S$, the width of sheet 1 is designated as $W_S$, the width of attachment sheet 4 is designated as $W_A$, and the width of the portion of the strip portion of polymer film 15 removed in attachment sheet 4 is designated as $W_D$. $W_D$ is generally between 80% to 90% of $W_A$. The length of a Fin 25 is designated as $L_F$, and the width thereof is designated as $W_F$. In the embodiment shown in FIGS. 1–5, the fin length $L_F$ is equal to the difference between the width $W_S$ of sheet 1 and width $W_A$ of attachment sheet 4 ($L_F=W_S-W_A$); and the fin width $W_F$ is the same for each fin and is equal to the length $L_S$ of sheet 1 divided by one plus the number $N_C$ of cuts 5 ($W_F=L_S/[1+N_C]$), where the cuts 5 are substantially parallel and spaced at equal distances.

The length $L_S$ of sheet 1 may generally be as long as any one of the surface dimensions of component 24. The length $L_F$ of fins 25 may generally be as long as the height of the cooling space above the surface of heat-generating component 24. The width $W_S$ of sheet 1 may then be as wide as the length of fins 25 plus the desired width $W_A$ of the attachment strip 4. The thickness of composite sheet 1 may generally range between 25 $\mu$m (0.025 mm) and 800 $\mu$m (0.8 mm). The thickness may generally range between 25 $\mu$m and 400 $\mu$m for gaseous cooling fluids (e.g., air cooling), with 50 $\mu$m to 200 $\mu$m being a typical range. For liquid cooling fluids, the thickness may generally range between 100 $\mu$m and 800 $\mu$m, with 200 to 500 $\mu$m being a typical range.

In preferred embodiments, the fin length $L_F$, fin width $W_F$, and fin thickness (e.g., sheet thickness) are selected such that the fins 25 are flexible to the light touch of a human finger, or to the blowing of air by a human mouth. A quantitative definition of fin flexibility is that the free end of fin 25 (or sheet 1) is deflected by at least 0.05 radians (e.g., 5% of fin length) when a torque of 0.02 N-cm per centimeter of fin width is applied at the free end. This amount of torque is roughly equal to placing a weight of 0.4 grams at the free end of a fin which is oriented horizontally and which has a length $L_F$ of 5 cm and a width $W_F$ of 1 cm. (0.4 grams is the approximate weight of a small, standard American paper clip, and 0.4 grams corresponds to a force of 0.00392 N.) For air cooled environments, the flexibility of the fins preferably deflect by at least 0.1 radians (e.g., 10% of fin length) when a torque of 0.02 N-cm per centimeter of fin width is applied at the free end, and more preferably by at least 0.2 radians. These quantitative measures of flexibility may be equally applied to sheet 1 before cuts 5 are formed. (These measures of flexibility, as applied to sheet 1, are useful for the embodiments described below where each end of the fins are attached to respective attachment strips.)

For packaged IC-chip modules, an exemplary length $L_S$ for sheet 1 may range between approximately 4 cm and approximately 8 cm, an exemplary width $W_S$ for sheet 1 may range between approximately 2.5 cm and approximately 5 cm, an exemplary width $W_A$ for the attachment sheet 4 may range between approximately 0.5 cm and 1.5 cm, and an exemplary thickness of sheet 1 may range between approximately 50 μm and approximately 400 μm for gaseous cooling fluids and between approximately 200 μm and approximately 800 μm for liquid cooling fluids. An exemplary fin length $L_F$ may range between approximately 2 cm and 4 cm, and an exemplary fin width $W_F$ may range between approximately 0.2 cm and 1 cm. An exemplary aspect ratio between fin length and fin width ($L_F/W_F$) may range between approximately 4 and approximately 20.

For integrated circuit applications where the heatsink is attached directly to the back surface of the IC chip or an individual IC chip package, many of the above exemplary dimensions may be reduced by a factor of approximately 2. Thus, an exemplary length $L_S$ for sheet 1 may range between approximately 1.2 cm and 3.5 cm, an exemplary width $W_S$ for sheet 1 may range between approximately 1 cm and approximately 3 cm, an exemplary width $W_A$ for the attachment sheet 4 may range between approximately 0.2 cm and 0.5 cm, and an exemplary thickness of sheet 1 may range between approximately 25 μm and approximately 200 μm for gaseous cooling fluids and between approximately 100 μm and approximately 400 μm for liquid cooling fluids. An exemplary fin length $L_F$ may range between approximately 1 cm and 3 cm, and an exemplary fin width $W_F$ may range between approximately 0.1 cm and 0.5 cm. An exemplary aspect ratio $L_F/W_F$ may range between approximately 3 and approximately 20.

The dimensions for an exemplary heatsink structure which is suited to cooling a 5 cm by 5 cm multichip package is provide in TABLE II below. The dimensions listed in TABLE II result in fins 25 occupying a volume of approximately 5 cm by 5 cm by 2.5 cm (62.5 cm³), with a total surface area of 675 cm². Of the 62.5 cm³ volume occupied by the fins, 13.5 cm³ is occupied by sheets 1, which is 22% of the volume, and 49.5 cm³ is occupied by the cooling fluid, which is 78% of the volume. With this construction, the heatsink structure can cool the heat-producing component with a very small temperature rise of 0.1° C. per watt of heat generated by the component under air cooling conditions, which represents very high cooling efficiencies.

TABLE II

| | |
|---|---|
| Length of sheet 1 ($L_S$) | 5.0 cm |
| Width of sheet 1 ($W_S$) | 3.1 cm |
| Width of strip 4 ($W_A$) | 0.4 cm |
| thickness of sheet 1 | 200 μm (95 μm thick copper foil) |
| Number of slits per sheet ($N_C$) | 19 (evenly spaced, provides 20 fins) |
| Width of fin 25 ($W_F$) | 0.25 cm |
| Length of fin 25 ($L_F$) | 2.5 cm |
| Number of sheets laminated per row | 6 (alternating from side to side) |
| Number of rows on the package | 9 (evenly spaced) |

This high cooling efficiency is achieved by the increased turbulence generated by the movement and vibration of the fins 25, and by the fins 25 having a large collective surface area for a relatively small amount of collective volume. The high cooling efficiency enables lower cooling velocities and lower pressure drops to be used in the cooling fluid. The relatively small collective volume of fins 25 presents a lower resistance to the flow of the cooling fluid, thereby further enabling low pressure drops in the cooling fluid. The lower velocity and pressure drop in the cooling fluid provide for lower manufacturing costs since simple cooling equipment may be employed, and provide for lower operating costs since lower velocities and pressure drops require less energy to be expended by the cooling equipment. In contrast, a rigid-fin heat sink having a surface area of 675 cm² in a volume of 62.5 cm² would have fins that occupy more than 60% of the volume (rather than 22%), which would leave less than 40% of the volume for the cooling fluid.

In some constructed embodiments of the present invention, the width of strip 22 is equal to or greater than the width $W_A$ of strip 4, and overlaps a thin strip of polymeric layer 15 which is adjacent to strip 4. When the bundle is attached to the heat generating component, this construction has the effect of clamping a thin strip of polymeric film 15 of each sheet 1 between strip 22 and the heat-generating element. This clamping increases the mechanical stability of the fins at the 90° bend by having the polymeric material bent along with the heat-conductive material (heat may be used to plastically deform the polymeric material at the bend). When the width of strip 22 is equal to $W_A$, strip 22 may be made to overlap the polymeric films of the sheets on each of the left side and the right side by an amount equal to ½($W_A$–$W_D$) (see FIGS. 1 and 2 for $W_A$ and $W_D$). A width of strip 22 equal to [$W_A$+($W_A$–$W_D$)] would enable this overlap to be equal to ($W_A$–$W_D$).

While the cooling fins 25 have been shown as being grouped together on sheets 1, it may be appreciated that the cooling fins may be formed separately and attached to a heat generating element one at a time. Such a single-fin construction approach may be useful for small components, such as surface mount resistors. It may be further appreciated that several single cooling fins may be attached (i.e., physically coupled) to one another at their first ends prior to being assembled onto the heat generating element.

In the heatsink structure shown in FIGS. 1–5, high cooling efficiency is achieved when the cooling fluid is flowed parallel to the rows of bundles 23, or is drawn upward from the top of the structure such that the fluid flows in at the bottom of the structure and flows along the lengths of the fins, or is forced down toward the tops of the fins 25. In the latter case, stiffer fins may be used. A cooling fan is shown at 30 in FIG. 4. Fan 30 may draw air away from fins 25, or may force air down toward fins 25. Fan 30 may be positioned along the front or back side of the heat sink structure.

Better omnidirectional cooling may be obtained by using shorter row lengths of bundles 23 and alternating the orientation of the bundle rows, as shown by a second embodiment of the present invention in FIG. 6. In the structure shown in FIG. 6, fan 30 may be placed at any of the four sides to provide the same cooling performance.

A third embodiment of the present invention is shown in FIG. 7. In this embodiment, each fin is disposed between two surfaces, or plates, 34A and 34B which are to be cooled. Each longitudinal end of a fin 25 is attached to a respective surface 34A and 34B. As before, the fins may be formed from sheets and grouped in bundles, with the bundles being shown at 33 in FIG. 7. As before, the fin sheets may be assembled onto an assembly tool and then bonded or soldered to an attachment strip 22. Each exemplary bundle 33 comprises two attachment strips 22 and six sets of fins (more or less sets may be used.) There are two inner sets 25A of fins, one on each side of attachment strips 22; two outer sets 25C of fins on either side of sets 25A; and two sets 25B, each being between a set 25A and a set 25C. In order to space one set from and an adjacent outer set, the fins of the inner set may be made shorter than the fins of the outer set, and/or may be creased with folds. As illustrated in FIG. 7, the fins of inner set 25A have been creased with folds to create space between inner set 25A and intermediate set 25B, and the fins of intermediate set 25B have been made shorter than the fins of outer set 25C. Pins or spacers 37 may be used to keep surfaces 34A and 34B at a substantially fixed distance.

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An apparatus for cooling a heat generating element, comprising:
   a composite sheet comprising a film of thermally conductive material and a film of polymeric material, each film comprising a first surface having a perimeter, a second surface parallel to the first surface and having a perimeter, and one or more edges disposed between the perimeters of the first and second surfaces; and
   an attachment region disposed on one of the surfaces of said film of thermally conductive material for attachment to the heat generating element or to an attachment region of another said apparatus; and
   a plurality of cooling fins defined in said composite sheet, each fin having a first end, a second end, and a portion of said film of a thermally conductive material disposed between said first and second ends which provides a heat-exchanging surface for contact with a cooling fluid.

2. The apparatus of claim 1 wherein at least two of said cooling fins are substantially parallel.

3. The apparatus of claim 1 wherein said thermally conductive material comprises at least one of the chemical elements of copper, silver, gold, aluminum, nickel, and zinc.

4. The apparatus of claim 1 wherein said polymeric material comprises at least one of the materials of polyimide, polyester, polyamide, and benzocyclobutene.

5. The apparatus of claim 1 wherein said thermally conductive material comprises copper and said polymeric material comprises polyimide.

6. The apparatus of claim 1 wherein at least one cooling fin has a length, width, and a ratio of length to width which is at least equal to three.

7. The apparatus of claim 1 wherein the film of thermally-conductive material and the film of polymeric material are laminated together with the use of an adhesive.

8. The apparatus of claim 1 wherein the film of thermally-conductive material and the film of polymeric material are laminated by thermo-compression bonding the two films together.

9. The apparatus of claim 1 wherein each said cooling fin has a length $L_F$ between its first and second ends, and a width $W_F$, each said fin being sufficiently flexible such that its first end may be deflected by at least 0.05 radians with respect to its second end with the second end being held stationary and a torque of 0.02 Newton-cm per centimeter of its width $W_F$ being applied at the first end.

10. The apparatus of claim 9 wherein a plurality of said cooling fins may be deflected by at least 0.1 radians with said torque being applied.

11. The apparatus of claim 1 wherein the thickness of each said cooling fin is less than approximately 500 $\mu$m.

12. The apparatus of claim 11 wherein said polymeric material has a thermal conductivity, and wherein said thermally conductive material has a thermal conductivity which is at least 100 time greater than the thermal conductivity of said polymeric material.

13. The apparatus of claim 11 wherein said thermally conductive material having a thermal conductivity which is greater than 50 W/m·K.

14. The apparatus of claim 1 wherein the thickness of each said cooling fin is less than approximately 200 $\mu$m.

15. The apparatus of claim 14 wherein said polymeric material has a thermal conductivity, and wherein said thermally conductive material has a thermal conductivity which is at least 100 time greater than the thermal conductivity of said polymeric material.

16. The apparatus of claim 14 wherein said thermally conductive material having a thermal conductivity which is greater than 50 W/m·K.

17. The apparatus of claim 1 wherein said polymeric material has a thermal conductivity, and wherein said thermally conductive material has a thermal conductivity which is at least 100 time greater than the thermal conductivity of said polymeric material.

18. The apparatus of claim 17 wherein said thermally conductive material having a thermal conductivity which is greater than 50 W/m·K.

19. The apparatus of claim 1 wherein said thermally conductive material having a thermal conductivity which is greater than 50 W/m·K.

20. The apparatus of claim 1 wherein said film of polymeric material has a thermal conductivity which is less than the thermal conductivity of said thermally conductive material.

* * * * *